US 9,105,703 B2

(12) United States Patent
Briere

(10) Patent No.: US 9,105,703 B2
(45) Date of Patent: Aug. 11, 2015

(54) PROGRAMMABLE III-NITRIDE TRANSISTOR WITH ALUMINUM-DOPED GATE

(75) Inventor: Michael A. Briere, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 13/021,437

(22) Filed: Feb. 4, 2011

(65) Prior Publication Data

US 2011/0227090 A1   Sep. 22, 2011

Related U.S. Application Data

(60) Provisional application No. 61/340,802, filed on Mar. 22, 2010.

(51) Int. Cl.
*H01L 23/58* (2006.01)
*H01L 29/778* (2006.01)
*H01L 29/20* (2006.01)
*H01L 29/207* (2006.01)
*H01L 29/423* (2006.01)
*H01L 29/80* (2006.01)

(52) U.S. Cl.
CPC ........ *H01L 29/7787* (2013.01); *H01L 29/2003* (2013.01); *H01L 29/207* (2013.01); *H01L 29/4232* (2013.01); *H01L 29/42316* (2013.01); *H01L 29/803* (2013.01)

(58) Field of Classification Search
None
See application file for complete search history.

(56) References Cited

U.S. PATENT DOCUMENTS 8,062,931 B2 *  11/2011  Lorenz et al. ............... 438/115
2003/0020092 A1   1/2003  Parikh
(Continued)

FOREIGN PATENT DOCUMENTS

JP      2008-270847      11/2008
WO   WO 2005/070009      8/2005
(Continued)

OTHER PUBLICATIONS

Priya Mukundhan, Henry H. Du, and Stephen P. Withdrow, Oxidation Studies of Aluminum-implanted NBD 200 Silicon Nitride, Mar. 8, 2001, American Ceramic Society Journal, 85[4], pp. 865-872.*
S. Sugiura, S. Kishimoto, T. Mizutani, M. Kuroda, T. Ueda and T. Tanaka, Enhancement-mode n-channel GaN MOSFETs Fabricated on p-GaN using HfO2 as gate oxide, The Institution of Engineering and Technology, Jun. 20, 2007, vol. 43 No. 17.*

*Primary Examiner* — David Vu
*Assistant Examiner* — Cuong Nguyen
(74) *Attorney, Agent, or Firm* — Farjami & Farjami LLP

(57) ABSTRACT

Disclosed is a III-nitride heterojunction device that includes a conduction channel having a two dimensional electron gas formed at an interface between a first III-nitride material and a second III-nitride material. A modification including a contact insulator, for example, a gate insulator formed under a gate contact, is disposed over the conduction channel, wherein the contact insulator includes aluminum to alter formation of the two dimensional electron gas at the interface. The contact insulator can include AlSiN, or can be SiN doped with aluminum. The modification results in programming the threshold voltage of the III-nitride heterojunction device to, for example, make the device an enhancement mode device. The modification can further include a recess, an ion implanted region, a diffused region, an oxidation region, and/or a nitridation region. In one embodiment, the first III-nitride material comprises GaN and the second III-nitride material comprises AlGaN.

20 Claims, 3 Drawing Sheets

(56) References Cited

U.S. PATENT DOCUMENTS

2009/0146185 A1* 6/2009 Suh et al. .................. 257/194
2009/0267078 A1  10/2009 Mishra
2010/0025730 A1* 2/2010 Heikman et al. ............ 257/194

FOREIGN PATENT DOCUMENTS

WO    WO 2008/147538    12/2008
WO    WO 2009/038809    3/2009

* cited by examiner

US 9,105,703 B2

PROGRAMMABLE III-NITRIDE TRANSISTOR WITH ALUMINUM-DOPED GATE

The present application claims the benefit of and priority to a provisional application entitled "Programmable III-Nitride Transistor with Aluminum-Doped Gate," Ser. No. 61/340,802 filed on Mar. 22, 2010. The disclosure in that provisional application is hereby incorporated fully by reference into the present application.

DEFINITION

In the present application, "group III-V semiconductor" or the like refers to a compound semiconductor that includes at least one group III element and at least one group V element, such as, but not limited to, gallium nitride (GaN), gallium arsenide (GaAs), aluminum gallium arsenide (AlGaAs), indium gallium nitride (InGaN) and the like. Analogously, "III-nitride semiconductor" or the like refers to a compound semiconductor that includes nitrogen and at least one group III element, such as, but not limited to, GaN, AlGaN, InN, AlN, InGaN, InAlGaN and the like.

BACKGROUND OF THE INVENTION

1. Field of the Invention

The present invention relates generally to semiconductors, and more particularly to transistors and devices based on III-nitride semiconductors.

2. Background Art

Devices based on III-nitride heterojunction structures typically operate using piezoelectric polarization fields to generate a two dimensional electron gas (2DEG) that allows for high current densities with low resistive losses. The 2DEG is formed by an interface of III-nitride materials and, due to the 2DEG, conventional III-nitride heterojunction devices may conduct without the application of a gate potential. Thus, devices that are formed using III-nitride heterojunction structures tend to be nominally ON, or depletion mode devices.

III-nitride heterojunction devices are desirable for power applications due to relatively high breakdown voltage, high current density, and low "on resistance." However, the nominally ON nature of conventional III-nitride heterojunction devices can introduce problems when used in power applications. For example, in power applications it is desirable to avoid conducting current through III-nitride heterojunction devices before control circuitry is fully powered and operational. Accordingly, it would be desirable to provide III-nitride heterojunction devices that are nominally OFF, or enhancement mode to, for example, avoid current conduction problems during start-up and other modes.

SUMMARY OF THE INVENTION

The present application is directed to a programmable III-nitride transistor with aluminum-doped gate, substantially as shown in and/or described in connection with at least one of the figures, as set forth more completely in the claims.

DETAILED DESCRIPTION OF THE INVENTION

The present invention is directed to III-nitride devices, particularly enhancement mode III-nitride devices, including modification to alter formation of 2DEG (two dimensional electron gas). Modifications based on aluminum introduction, for example by doping or other methods, are of notable interest in the present invention. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. While GaN and AlGaN materials are specifically referred to in this application, different materials can be used such that an interface between the materials can form a conductive channel including 2DEG. Furthermore, while two III-nitride materials and layers are described, it will be appreciated that additional materials and layers can be included without departing from the scope of the present invention.

Figure 1A:
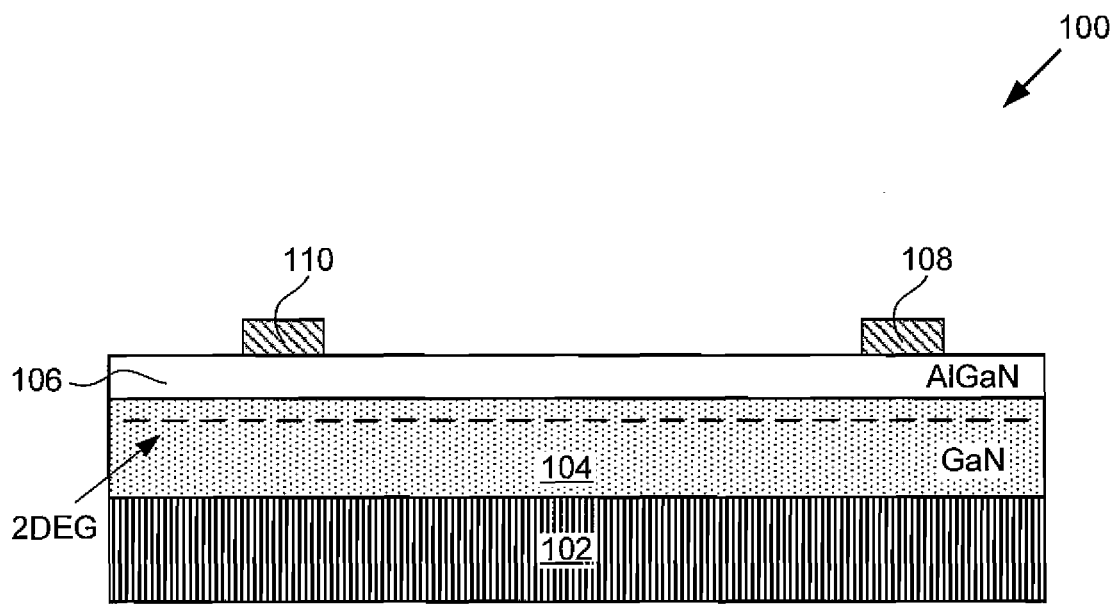
FIG. 1a illustrates a cross-sectional view corresponding to an initial structure used in forming the exemplary III-nitride heterojunction device in FIG. 1b.
Figure 1B:
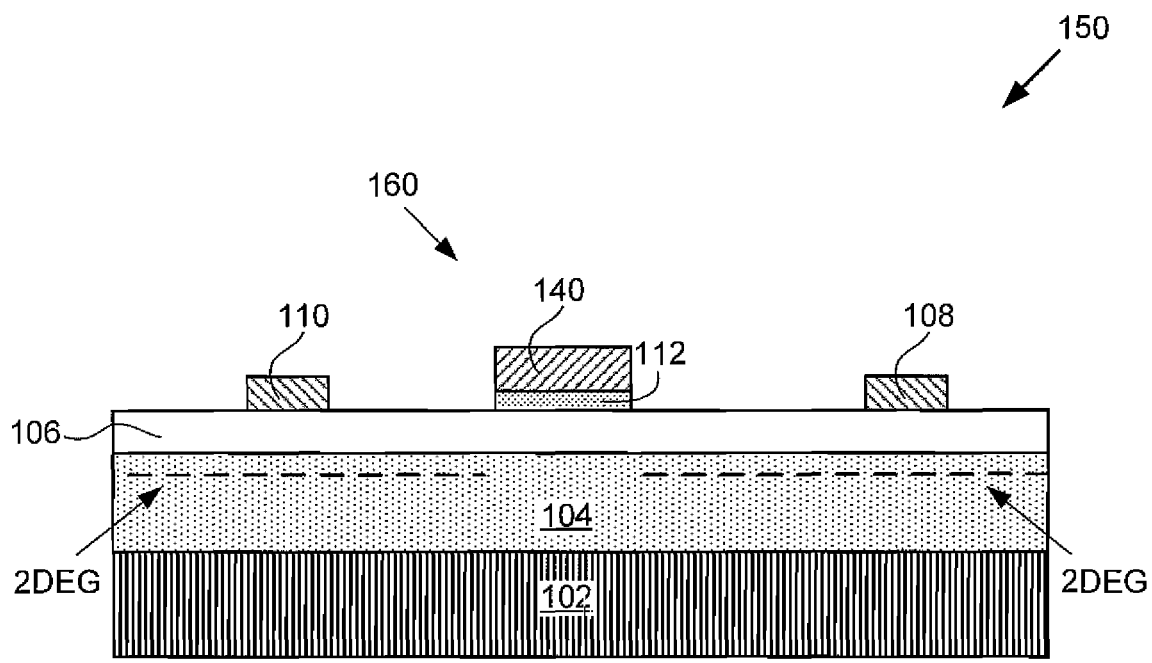
FIG. 1b illustrates a cross-sectional view of an exemplary III-nitride heterojunction device in accordance with one embodiment of the present invention.

FIG. 1a shows a cross-sectional view corresponding to an initial structure, illustrated as structure 100, used in forming the exemplary III-nitride heterojunction device in FIG. 1b. Structure 100 includes Substrate 102, III-nitride material 104, and III-nitride material 106. In some embodiments, III-nitride material 104 can comprise, for example, undoped GaN and III-nitride material 106, can comprise, for example, undoped AlGaN to form a high electron mobility transistor (HEMT). In other embodiments the III-nitride materials can be doped, for example, III-nitride material 104 can comprise P-type GaN to form an N-channel GaN field effect transistor (FET).

Substrate 102 can comprise an insulating substrate, but can be highly resistive, and can comprise materials such as silicon carbide, silicon, sapphire, and other suitable substrate materials. In FIG. 1a, III-nitride material 104 is disposed over Substrate 102 and III-nitride material 106 is disposed on III-nitride material 104 forming a III-nitride heterojunction. III-nitride material 104 has a different in-plane lattice constant than III-nitride material 106 such that a conductive channel with 2DEG can form at the interface of III-nitride material 104 and III-nitride material 106.

Also shown in FIG. 1a, contacts 108 and 110 are formed on III-nitride material 106 and can comprise, for example, ohmic contacts. Thus, structure 100 can be configured such that current can flow between contacts 108 and 110 in the conductive channel with 2DEG. Furthermore, contacts 108 and 110 can comprise connections for source and drain terminals in the resulting III-nitride heterojunction device.

FIG. 1b shows a cross-sectional view of an exemplary III-nitride heterojunction device in accordance with one embodiment of the present invention illustrated as III-nitride heterojunction device 150. A device according to the present invention includes a modification to alter formation of 2DEG thereby programming the threshold voltage of the III-nitride heterojunction device. In particular embodiments, the modification can alter the density of 2DEG, whereby the device can be rendered nominally OFF, i.e. the 2DEG is interrupted.

FIG. 1b shows modification 160, which alters formation of 2DEG in III-nitride heterojunction device 150. In III-nitride heterojunction device 150, modification 160 comprises a negatively charged gate contact insulator 112, which includes aluminum, disposed under gate contact 140. Contact insulator 112 includes aluminum to generate negative charges to alter or interrupt formation of 2DEG in III-nitride heterojunction device 150. Thus, the negative electrical charge in gate contact insulator 112 can interact with electrons in the 2DEG to alter formation of 2DEG.

In the embodiment shown in FIG. 1b, contact insulator 112 includes aluminum introduced by doping, implanting, or other means, such as concurrent growth of aluminum as part of formation of the gate contact insulator, to negatively charge the contact insulator for interrupting the 2DEG thereunder, thereby interrupting the current carrying channel in III-nitride heterojunction device 150. In an inactive state, III-nitride heterojunction device 150 does not conduct current between contacts 108 and 110 because the current carrying channel with 2DEG is interrupted underneath gate contact 140. Contact 140 can comprise, for example, a conductive gate contact and contact insulator 112 can comprise a gate insulator. Thus, III-nitride heterojunction device 150 can be operable to carry current between contacts 108 and 110 by applying electric potential to contact 140 to reestablish interrupted 2DEG and to provide a current carrying channel between contacts 108 and 110. As such, III-nitride heterojunction device 150 can operate as an enhancement mode, or normally OFF device.

In some embodiments, contact insulator 112 can be formed by providing an insulator and doping or implanting the insulator with aluminum to provide negative charge in contact insulator 112. For example, a Silicon Nitride (SiN) insulator can be diffused with or implanted with aluminum to provide negative charges in contact insulator 112. In particular embodiments contact insulator 112 can comprise a composition of $Al_xSi_yN_z$ (also referred to herein as "AlSiN"). In other embodiments contact insulator 112 can comprise a compound concurrently grown with aluminum to provide negative charges in therein. For example, an AlSiN compound can be formed over III-nitride material 106.

Also in III-nitride heterojunction device 150, contact insulator 112 can include aluminum to program the threshold voltage of III-nitride heterojunction device 150. For example, the negative charge in contact insulator 112 can be adjusted by altering the composition of contact insulator 112. For example, in III-nitride heterojunction device 150, increasing negative charge in contact insulator 112 can increase its repulsive force to alter 2DEG. As such, increasing the negative charge in contact insulator 112 can increase threshold voltage such that increased electric potential must be applied to contact 140 to reestablish interrupted 2DEG and to provide a current carrying channel between contacts 108. Thus, selecting the composition of contact insulator 112 can program or set the threshold voltage of III-nitride heterojunction device 150.

It will be appreciated that structure 100 in FIG. 1a does not limit the formation of III-nitride heterojunction device 150. For example, in some embodiments, contacts 108 and 110 can be formed subsequent to modification 160. Also, while III-nitride heterojunction device 150 comprises an enhancement mode, or normally OFF device, in other embodiments contact insulator 112 can alter 2DEG formation to program or set threshold voltage in depletion mode devices.

Furthermore, while modification 160 as described above includes a contact insulator under a contact and over one of the III-nitride materials, in other embodiments, additional elements can cooperate to alter formation of 2DEG. Other embodiments can comprise, for example, a recess, an ion implanted region, a diffused region, an oxidation region, and/or a nitridation region. Furthermore, the additional elements can be combined in a III-nitride heterojunction device. It will be appreciated that the additional elements can be formed in additional materials or structures.

Figure 2:
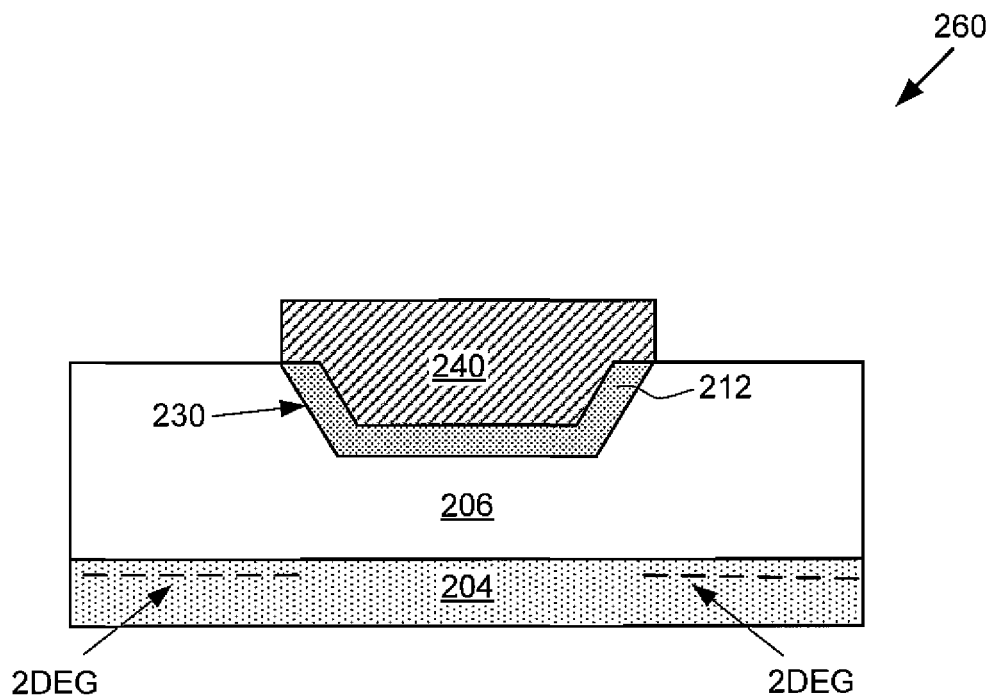
FIG. 2 illustrates a cross-sectional view of a portion of a III-nitride heterojunction device including an exemplary modification in accordance with one embodiment of the present invention.

Referring now to FIG. 2, FIG. 2 shows a cross-sectional view of a portion of a III-nitride heterojunction device including an exemplary modification illustrated as modification 260. Modification 260 can correspond to modification 160 in FIG. 1b. In FIG. 2, III-nitride material 204, III-nitride material 206, contact insulator 212, and contact 240, which can correspond to nitride material 104, III-nitride material 106, contact insulator 112, and contact 140 in FIG. 1b.

As shown in FIG. 2, modification 260 includes contact insulator 212 formed over recess 230. Recess 230 is formed in III-nitride material 206 under contact 240 and can alter formation of 2DEG under gate contact 240. Furthermore, recess 230 permits contact 240 and contact insulator 212 to be disposed closer to the 2DEG and the interface of III-nitride material 206 and III-nitride material 204. In modification 260, recess 230 and contact insulator 212 cooperate to alter formation of 2DEG. Thus, in modification 260, contact insulator 212 can require less charge to program threshold voltage and interrupt 2DEG formation relative to contact insulator 112 in FIG. 1b.

Recess 230 can be formed, for example, by disposing photoresist over III-nitride material 206 and forming openings with sloped sidewalls in the photoresist to permit an etching step to transfer sloped geometry to III-nitride material 206. While recess 230 includes sloping sidewalls, in will be appreciated that recess 230 can comprise other geometries.

Figure 3:
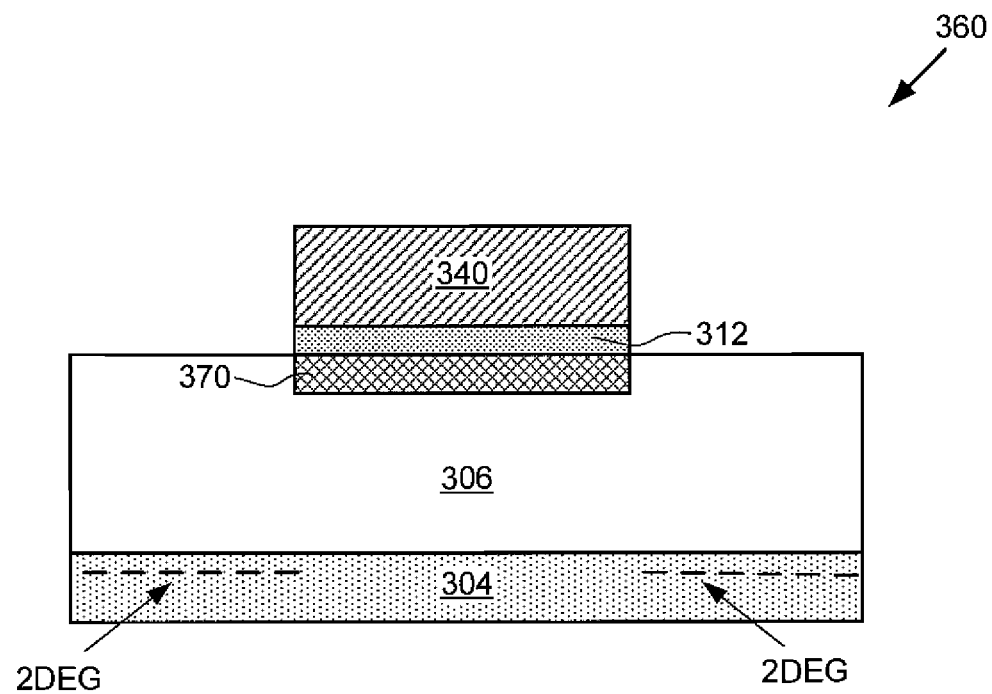
FIG. 3 illustrates a cross-sectional view of a portion of a III-nitride heterojunction device including an exemplary modification in accordance with one embodiment of the present invention.

Referring now to FIG. 3, a cross-sectional view of a portion of a III-nitride heterojunction device including an exemplary modification illustrated as modification 360 is shown. Modification 360 can correspond to modification 160 in FIG. 1b. In FIG. 3, III-nitride material 304, III-nitride material 306, contact insulator 312, and contact 340, which can correspond to nitride material 104, III-nitride material 106, contact insulator 112, and contact 140 in FIG. 1b.

As shown in FIG. 3, modification 360 includes contact insulator 312 formed over region 370. Region 370 is formed in III-nitride material 306 under contact 340 and can alter formation of 2DEG under gate contact 340. In modification 360, region 370 and contact insulator 312 cooperate to alter formation of 2DEG.

In some embodiments region 370 can comprise an implanted region including lattice damage, which can disrupt the bond structure and 2DEG thereunder. In other embodiments, region 370 can comprise a region oxidized, nitridized, or diffused with dopants. Also, as described above, modification 360 can comprise additional elements, such as a recess similar to recess 230 and/or multiple regions similar to region 370. While in FIG. 3 region 370 is formed in III-nitride material 306, in other embodiments region 370 can be formed in III-nitride material 304 or in other materials. Furthermore, in some embodiments region 370 can overlap materials, for example, III-nitride materials 306 and 304. Thus, in modification 360, contact insulator 312 can require less charge to program threshold voltage and interrupt 2DEG formation relative to contact insulator 112 in FIG. 1b.

Figure 4:
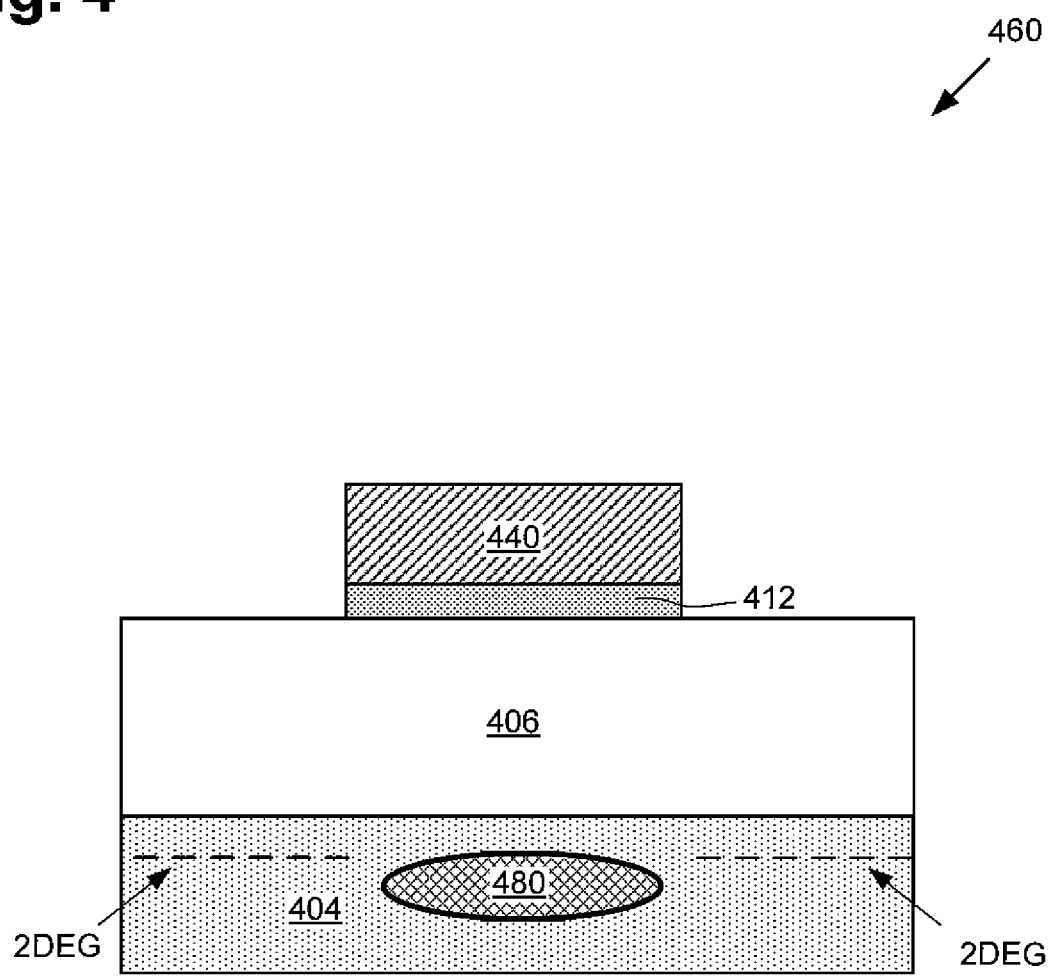
FIG. 4 illustrates a cross-sectional view of a portion of a III-nitride heterojunction device including an exemplary modification in accordance with one embodiment of the present invention.

Referring now to FIG. 4, a cross-sectional view of a portion of a III-nitride heterojunction device including an exemplary modification illustrated as modification 460 is shown. In FIG. 4, III-nitride material 404, III-nitride material 406, contact insulator 412, and contact 440, which can correspond to nitride material 104, III-nitride material 106, contact insulator 112, and contact 140 in FIG. 1b.

As shown in FIG. 4, modification 460 includes contact insulator 412 formed over region 480. Region 480 is formed in III-nitride material 404 under contact 340 and can alter formation of 2DEG under gate contact 340. In other embodiments region 480 can be formed in III-nitride material 406 or overlapping III-nitride materials 404 and 406. In modification 460, region 480 and contact insulator 412 cooperate to alter formation of 2DEG. Thus, in modification 460, contact insulator 412 can require less charge to program threshold voltage and interrupt 2DEG formation relative to contact insulator 112 in FIG. 1b.

Region 480 can comprise, for example, a region doped with p type dopants. Standard implantation and annealing steps can be used to form region 480 through III-nitride material 406. In some embodiments region 480 can be formed in III-nitride material 404, and subsequently covered by a layer of GaN, followed by AlGaN. P type dopants used for forming region 480 can comprise, for example, Fl, Mg, Fe, Cr, or Zn although other dopants can be used.

In the embodiments in FIGS. 1b and 2 through 4, a modification is provided to alter formation of 2DEG in the conduction channel of a III-nitride heterojunction device. The modification can program the threshold voltage of the device and can alter formation of 2DEG in the conduction channel to interrupt the 2DEG to obtain a nominally OFF device, rather than a nominally ON device. Accordingly, the present invention can provide for enhancement mode III-nitride heterojunction devices that can, for example, be used in power applications without being compensated during start-up to avoid conducting current while control circuitry is powering up. Moreover, the invention provides for programming, i.e. adjusting, the threshold voltage of a resulting enhancement mode device (or even programming the threshold voltage of a depletion mode device).

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A III-nitride heterojunction device comprising:
    a conduction channel including a two dimensional electron gas formed in a first III-nitride material at an interface between said first III-nitride material and a second III-nitride material;
    first and second ohmic contacts configured to conduct current through said conduction channel without directly contacting said first III-nitride material;
    a modification including a contact insulator disposed over said conduction channel, said contact insulator diffused or implanted with aluminum to charge said contact insulator to form a negatively charged contact insulator, said charge altering formation of said two dimensional electron gas at said interface.

2. The III-nitride heterojunction device of claim 1, wherein said contact insulator comprises AlSiN.

3. The III-nitride heterojunction device of claim 2, wherein said contact insulator is grown as a compound.

4. The III-nitride heterojunction device of claim 1, wherein said contact insulator comprises SiN doped with aluminum.

5. The III-nitride heterojunction device of claim 1, wherein said modification programs a threshold voltage of said III-nitride heterojunction device.

6. The III-nitride heterojunction device of claim 1, wherein said modification alters formation of said two dimensional electron gas to interrupt said conduction channel.

7. The III-nitride heterojunction device of claim 1, wherein said modification further includes a recess.

8. The III-nitride heterojunction device of claim 1, wherein said modification further includes an ion implanted region.

9. The III-nitride heterojunction device of claim 1, wherein said modification further includes a diffused region.

10. The III-nitride heterojunction device of claim 1, wherein said modification further includes an oxidation region.

11. The III-nitride heterojunction device of claim 1, wherein said modification further includes a nitridation region.

12. The III-nitride heterojunction device of claim 1, wherein said contact insulator is a gate insulator formed under a gate contact.

13. The III-nitride heterojunction device of claim 1, wherein said first III-nitride material comprises GaN and said second III-nitride material comprises AlGaN.

14. The III-nitride heterojunction device of claim 1, wherein said III-nitride heterojunction device is an N-channel GaN FET.

15. An enhancement mode III-nitride heterojunction device comprising:
    a conduction channel including a two dimensional electron gas formed in a first III-nitride material at an interface between said first III-nitride material and a second III-nitride material;
    first and second ohmic contacts configured to conduct current through said conduction channel without directly contacting said first III-nitride material;
    a modification interrupting said conduction channel, said modification including a gate insulator disposed over said conduction channel, said gate insulator diffused or implanted with aluminum to charge said gate insulator to form a negatively charged gate insulator, said charge altering formation of said two dimensional electron gas at said interface.

16. The enhancement mode III-nitride heterojunction device of claim 15, wherein said gate insulator comprises AlSiN.

17. The enhancement mode Ill-nitride heterojunction device of claim 16, wherein said gate insulator is grown as a compound.

18. The enhancement mode III-nitride heterojunction device of claim 15, wherein said gate insulator comprises SiN doped with aluminum.

19. The enhancement mode III-nitride heterojunction device of claim 15, wherein said modification programs the threshold voltage of said Ill-nitride heterojunction device.

20. The enhancement mode III-nitride heterojunction device of claim 15, wherein said first III-nitride material comprises GaN and said second III-nitride material comprises AlGaN.

\* \* \* \* \*